(12) United States Patent
Fulton et al.

(10) Patent No.: US 9,318,861 B2
(45) Date of Patent: Apr. 19, 2016

(54) METER COLLAR FOR PLUG-IN CONNECTION OF DISTRIBUTED POWER GENERATION

(71) Applicant: ConnectDER LLC, Falls Church, VA (US)

(72) Inventors: Whitman Fulton, Falls Church, VA (US); Adam Koeppel, Washington, DC (US)

(73) Assignee: ConnectDER LLC, Falls Church, VA (US)

( * ) Notice: Subject to any disclaimer, the term of this patent is extended or adjusted under 35 U.S.C. 154(b) by 0 days.

(21) Appl. No.: 14/251,123

(22) Filed: Apr. 11, 2014

(65) Prior Publication Data

US 2014/0218010 A1   Aug. 7, 2014

Related U.S. Application Data

(63) Continuation-in-part of application No. 13/664,693, filed on Oct. 31, 2012.

(60) Provisional application No. 61/554,558, filed on Nov. 2, 2011.

(51) Int. Cl.
| | |
|---|---|
| *G01R 11/24* | (2006.01) |
| *G01R 11/04* | (2006.01) |
| *H01R 33/945* | (2006.01) |
| *H01R 33/90* | (2006.01) |
| *G01R 22/06* | (2006.01) |

(52) U.S. Cl.
CPC ............ *H01R 33/945* (2013.01); *G01R 22/063* (2013.01); *G01R 22/065* (2013.01); *H01R 33/90* (2013.01)

(58) Field of Classification Search
CPC .... G01R 22/00; G01R 22/063; G01R 22/065; G01R 11/02; H01R 33/90; H01R 33/945; H02J 3/38; Y10T 307/615
USPC .................................. 324/110, 126; 439/517
See application file for complete search history.

(56) References Cited

U.S. PATENT DOCUMENTS

| | | | | |
|---|---|---|---|---|
| 5,453,725 | A | * | 9/1995 | You et al. ........................ 337/68 |
| 5,573,412 | A | * | 11/1996 | Anthony ...................... 439/133 |
| 6,188,145 | B1 | * | 2/2001 | Stewart ........................ 307/125 |
| 2002/0171436 | A1 | * | 11/2002 | Russell ......................... 324/602 |
| 2003/0034693 | A1 | * | 2/2003 | Wareham et al. ............... 307/23 |
| 2008/0154624 | A1 | * | 6/2008 | O'Neil .............................. 705/1 |
| 2008/0203820 | A1 | * | 8/2008 | Kramer ..................... H02J 3/38 307/64 |
| 2010/0225305 | A1 | * | 9/2010 | Reineccius ............ G01R 22/06 324/126 |

* cited by examiner

*Primary Examiner* — Melissa Koval
*Assistant Examiner* — Courtney McDonnough
(74) *Attorney, Agent, or Firm* — Brundidge & Stanger, P.C.

(57) ABSTRACT

An electric power meter collar with external electrical connection points enables expedited connection of distributed energy resources to the customer premises or the electric power grid. The meter collar is installed between an electric meter and the meter socket box that the meter would otherwise plug into at the site of a customer who receives two-phase service from an electrical utility company, and has electrical connection points that are electrically upstream and downstream of the meter. It enables "plug and play" connection of on-site power generation resources since the collar includes both a receptacle for a "plug" from on site power generation and overcurrent protection.

10 Claims, 8 Drawing Sheets

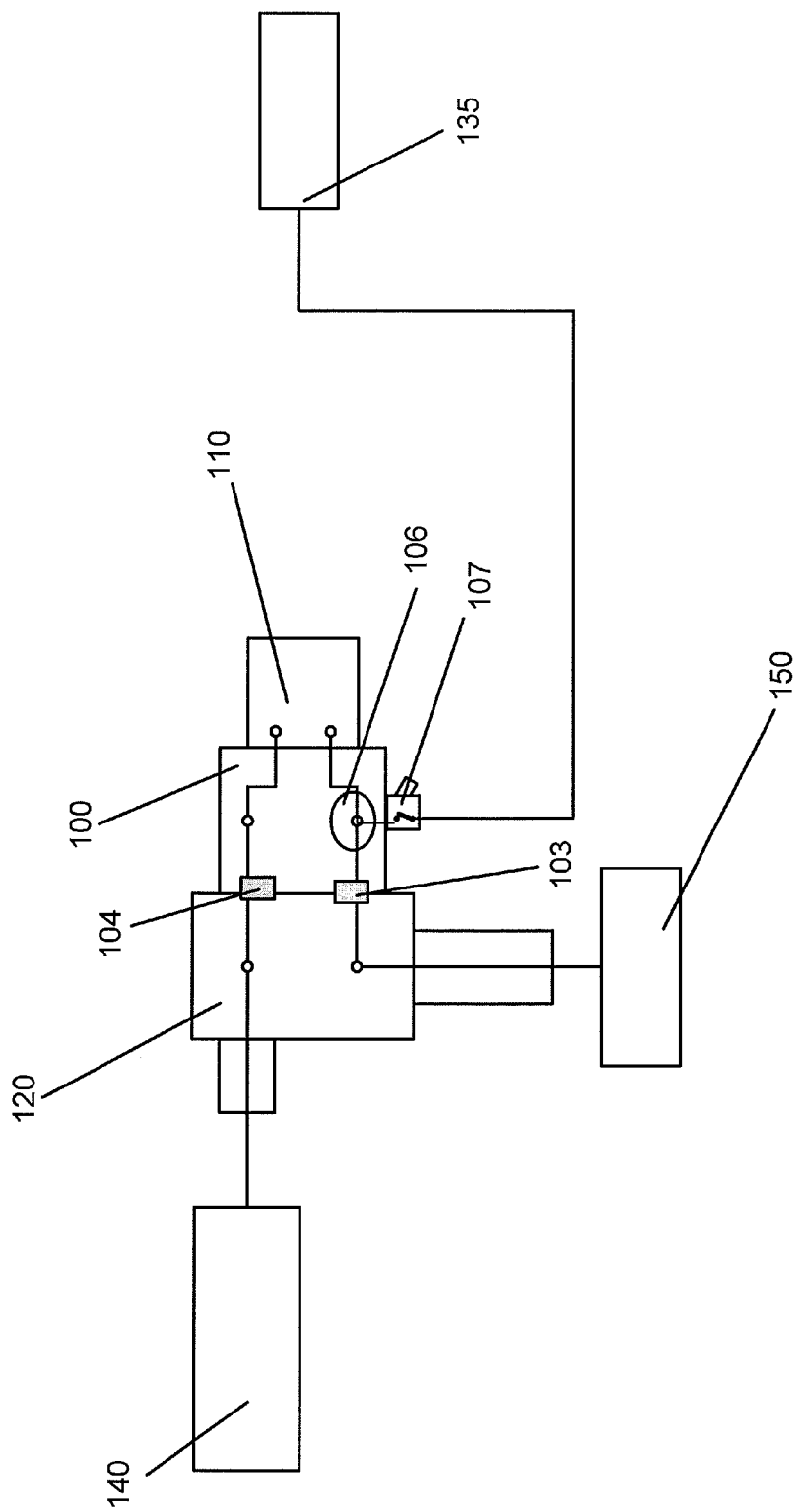

METER COLLAR FOR PLUG-IN CONNECTION OF DISTRIBUTED POWER GENERATION

BACKGROUND

Distributed power generation systems (alternatively "DPGS") are typically small, i.e., less than 1 MW, power generators that are connected directly to local electric distribution grids. In contrast, conventional large power plants are typically connected to a high-voltage electric transmission grid. Examples of a DPGS may include solar cell arrays, battery or fuel-cell storage systems, electric vehicles, and small wind turbines.

As developments in DPGS technologies progress, associated costs are falling and performance efficiencies are increasing. As a result, some customers of electric utility companies have expressed a preference for using power which they, the customers, generate or store locally or on-site. Utility companies (alternatively "utility" or "utilities") are also exploring options for owning and maintaining DPGS at the customer site, often in exchange for a leasing payment to the customer for use of a structure at the customer site.

Problems that may confront a utility or utility customer seeking to install a DPGS at a customer site may include modifications in wiring of the customer's private electrical distribution system (the "load-side" network) to accommodate the DPGS at the customer's residence or at a small business establishment. Installation of new dedicated electrical circuits that comply with necessary safety codes and standards often incur significant money and time expenditures and, moreover, given the rapid speed of evolution in DPGS, a customer may want to upgrade or replace an existing system with a new technology within a relatively short period of time. Replacing the existing technology safely requires another costly changeout of the wiring, thereby reducing the incentive to upgrade.

SUMMARY

In an example, a collar for a watt-hour meter may include one or more sockets that enable a plug-in interface that connects a DPGS to a residential or business structure (alternatively "structure") or to the distribution grid, while maintaining compliance to interconnection requirements for safety, power quality, and automatic disconnect capabilities.

BRIEF DESCRIPTION OF THE DRAWINGS

The foregoing and other features of this disclosure will become more fully apparent from the following description and appended claims, taken in conjunction with the accompanying drawings. The use of the same reference numbers in different figures indicates similar or identical items. Further, understanding that these drawings depict only several embodiments in accordance with the disclosure and are, therefore, not to be considered limiting of its scope, the disclosure will be described with additional specificity and detail through use of the accompanying drawings, in which:

FIG. 1b shows an overview of a utility-side system implemented by and for at least one embodiment of a meter collar for plug-in connection of grid-quality DPGS, in accordance with at least some of the embodiments described herein;

DETAILED DESCRIPTION

Figure 1A:
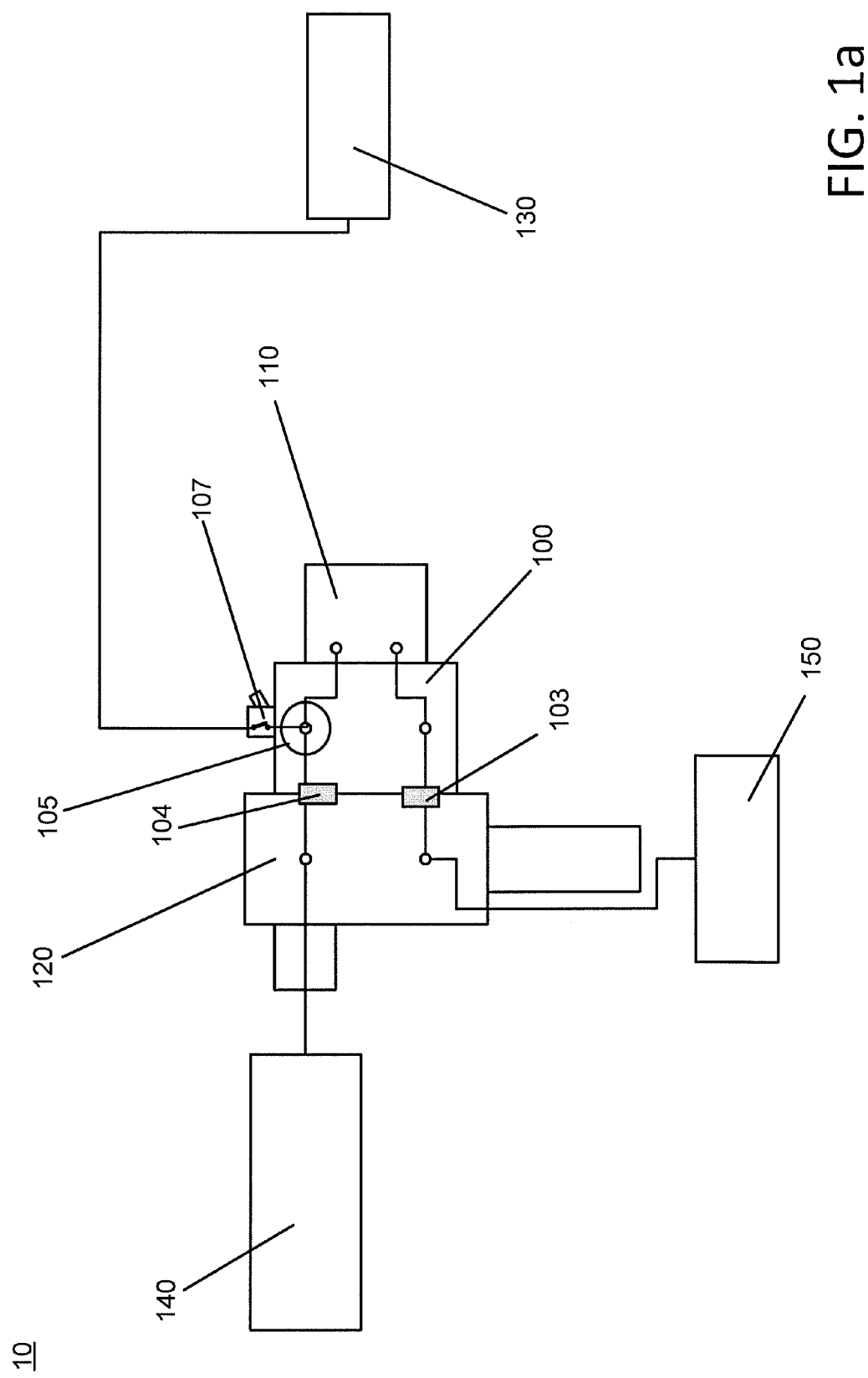
FIG. 1a shows an overview of a customer site-side system implemented by and for at least one embodiment of a meter collar for plug-in connection of grid-quality DPGS, in accordance with at least some of the embodiments described herein.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1a shows an overview of a customer site-side ("load side") system 10 implemented by and for at least one embodiment of a meter collar for plug-in connection of grid-quality DPGS, in accordance with at least some of the embodiments described herein. As depicted, system 10 includes a meter collar 100, an interface circuit 105, an externally resettable overcurrent protection device 107, a meter 110, a meter socket box 120, a site-side DPGS 130, an electricity network 140, and a distribution grid 150. Although illustrated as discrete components, various components may be divided into additional components, combined into fewer components, or eliminated while contemplated within the scope of the subject matter disclosed herein.

Meter collar 100 may be configured as an adapter that is inserted between meter socket box 120 and meter 110, and may include a housing that is provided with first contacts 103 for connecting with utility-side contacts of meter socket box 120 and that is further provided with second contacts 104 for connecting with customer-side contacts of meter socket box 120.

Meter collar 100 may plug into a meter socket of the meter socket box 120, utilizing connection points 103 and 104 disposed thereon that engage with the connection points of the meter socket box 120. Meter 110, in turn, may plug into the meter collar 100, which has connection points for engagement with the connection points of the meter. Meter collar 100 thus acts as an adapter between meter 110 and meter socket box 120, and is therefore configured to provide access to a customer's on-site electricity network 140. The interface circuits 105 and 106 are capable of connecting to DPGS 130 and 135, as illustrated and discussed hereafter.

By placing two or more sockets on meter collar 100, i.e., one electrically upstream ("line side") and one electrically downstream ("load side") of the meter, different ownership models for DPGS may be actuated. The upstream socket 106 may enable a corresponding utility or equivalent wholesale power provider to own the DPGS and to connect the power generator directly to the grid without passing the electrical energy through the customer's structure or meter. Alternatively, the downstream socket 105 may allow customers to own and to connect the DPGS directly to a private structure for private consumption, with only excess electrical energy being passed back through the meter to the grid.

According to at least one embodiment, meter collar 100 may house an "upstream" interface circuit 106 between the utility-side connection points of a residential meter box 120 and the utility-side connection points of an electric meter 110. The upstream interface circuit 106 provides a point of connection and/or disconnection for various types of on-site power generation systems directly with the distribution grid of the electric power utility. The upstream interface circuit 106 is electrically upstream of meter 110, thus creating a direct conduit between the on-site power and the electric utility distribution grid. Power generation systems connected to the upstream interface 106 are not electrically at the customer site, irrespective of whether they are physically located at the customer site.

According to at least one other embodiment, meter collar 100 may house a "downstream" interface circuit 105 between the private structure-side connection points of a meter box 120 and the private structure-side connection points of an electric meter 110. The downstream interface circuit 105 provides an easy point of connection and/or disconnection for various types of on-site power generation systems directly with the electric system of a customer site. The downstream interface circuit 105 is electrically downstream of meter 110, thus creating a direct conduit between the on-site power and the customer site's electric grid. Power generation systems connected to the downstream interface 105 are electrically at the customer site, irrespective of whether they are physically located at the customer site.

In accordance with at least one further embodiment, meter collar 100 may be disposed between a watt-hour electric meter 110 and a meter socket having utility-side contacts 103 that are connected to power lines of a utility and have customer-side contacts 104 that are connected to a load or loads. By such an embodiment, meter collar 100 may include a housing having first contacts 103 to connect to the utility-side contacts of the socket and second contacts 104 to connect to the customer-side contacts of the socket, as well as further contacts for connection with the meter.

In yet another example embodiment, meter collar 100 may house a standardized electric power socket, which is the upstream power socket, connected to the upstream interface circuit. Therefore when meter collar 100 is disposed between the meter socket box 120 and meter 110, the upstream power socket may provide a connection point to the upstream interface that is accessible from the outside of the structure upon which the meter box 120 is mounted. Power generation systems configured with the appropriate mate for the standardized electric socket may then be plugged directly into the upstream socket.

Further still, in accordance with yet another example embodiment, meter collar 100 may house a standardized electric power socket that is connected to the downstream interface circuit. Thus, when the meter collar is installed between the meter socket box 120 and meter 110, the downstream power socket may provide a connection point to the downstream interface that is accessible from the outside. Power generation systems configured with the appropriate mate for the standardized electric socket may then be plugged directly into the downstream socket.

With regard to safety of the person(s) connecting the DPGS equipment to the meter collar, a concern is that integrated contact points on either the upstream or downstream circuit may allow exposure to an electrical shock hazard. Thus, in accordance with at least one example embodiment, meter collar 100 may incorporate within the housing an overcurrent protection device 107, such as a circuit breaker or fuse block, that may be controlled from the exterior of the meter collar 100 to disconnect and reconnect the electrical current within from the circuit connection point or sockets 105, 106. In other circumstances, the overcurrent protection device 107 could also be controlled remotely or automated to reset itself.

With regard to the protection of the DPGS equipment, a concern is that integrated contact points on either the upstream or downstream circuit may allow surges in current that exceed the capabilities of the DPGS and may damage them or the premises. Thus, in accordance with at least one example embodiment, meter collar 100 may incorporate within the housing an overcurrent protection device 107, such as a circuit breaker or fuse block, that will automatically open the circuit in the event of a current surge that exceeds the rating of the overcurrent protection. The overcurrent protection device 107 may be controlled from the exterior of the meter collar 100 to disconnect and reconnect the electrical current within from the circuit connection point or sockets 105, 106. In other circumstances, the overcurrent protection device 107 could also be controlled remotely or automated to reset itself.

With regard to security, a concern is that the upstream socket may allow a customer or third party to connect additional, unmetered, load to the grid (instead of DPGS), in order to steal power. Thus, in accordance with at least one example embodiment, meter collar 100 may include a combination dummy plug 315 and electrical meter seal locking mechanism 340 to secure the sockets 210 and 230 when not in use. The locking mechanism may also secures the DPGS connection when it is in use.

Further, both the upstream socket and the downstream sockets may be secured with a dummy plug 315 made of electrically non-conducting material that is used to prevent access to the socket when not in use. In at least one embodiment, the dummy plug may be secured to meter collar 100 by a miniature locking ring 340. The meter locking ring is secured by means of any locking mechanism such as a padlock or security tag. Further still, the meter locking ring may also be used to secure the DPGS to the socket, when installed.

Accordingly, the combination of meter collar 100, standardized plug-and-socket interface, automatic outage and overcurrent grid disconnect, and locking mechanism 340, provide an effective solution that can significantly reduce the costs of deploying DPGS.

Meter collar 100 may be coupled to electric power meter 110 and to meter socket box 120. Thus, meter collar 100 may provide a connection point for a customer-owned DPGS 130 to on-site electric network 140. Electric energy produced by DPGS 130 may flow into on-site electric network 140 at which the electric energy may be either consumed or passed through the electric power meter 110 to electric distribution grid 150.

Electric power meter 110 may refer to an electric meter, either mechanical or electronic, that is electrically coupled to electric distribution grid 150 and to on-site electric network 140; and which may be configured to measure the flow of electricity therebetween.

Meter socket box 120 may refer to a dedicated point of interconnection for electric power meter 110 at a site at which electric energy may be consumed, and may be configured to house a socket into which electric power meter 110 or meter collar 100 may be inserted. Wiring may connect electric distribution grid 150 to meter socket box 120 and to electrically upstream connection points for electric power meter 110. Wiring may further connect electrically downstream points of electric power meter 110 to on-site electric network 140.

Site-side DPGS 130 may refer to a DGPS that may be disposed locally and connected to on-site electric network 140 through a connection 105 on meter collar 100 in a configuration that supports direct site-side integration. The connection point may be electrically downstream of electric power meter 110, although electric energy may flow upstream as well. It is noted that the term "site-side" may be used generically to refer to any locally sited DPGS that is configured to feed directly into on-site electric network 140.

On-site electric network 140 may refer to a local system of circuits that may carry electric energy from a point of interconnection with electric power distribution grid 150, e.g., electric power meter 110, for consumption on-site. On-site electric network 140 may be disposed electrically downstream of electric power meter 110, although electric energy may flow upstream as well.

Electric distribution grid 150 may refer to an electric utility-owned system of wires and equipment that may carry electric energy from a wholesale power grid to the point of interconnection with the on-site electric network 130.

FIG. 1b shows an overview of a utility-side system implemented by and for at least one embodiment of meter collar 100 for plug-in connection of grid-quality DPGS, in accordance with at least some of the embodiments described herein.

Meter collar 100 may be coupled to electric power meter 110 and to meter socket box 120, thus meter collar 100 may be configured to provide a connection point for utility-owned DPGS 135 to the electric distribution grid 150. Electric energy produced by DPGS 135 may flow into electric distribution grid 150, at which the electric energy may be either distributed to other points on the grid or passed through the electric power meter 110 to on-site electric network 140 as a part of the electric energy typically sourced from the wholesale power grid.

Grid-side DPGS 135 may refer to a DGPS disposed locally and connected to electric distribution grid 150 through a connection on meter collar 100 in a configuration that supports direct grid-side integration. The connection point may be disposed electrically upstream of electric power meter 110, although electric energy may flow downstream, as well. It is noted that that the term "grid-side" may be used generically to refer to any locally sited DPGS that feeds directly into utility electric network 150.

FIGS. 2a, 2b, 2c, and 2d show a meter collar socket interface point and interior circuit, in accordance with at least some of the embodiments described herein, in accordance with at least some of the embodiments described herein.

Figure 2A:
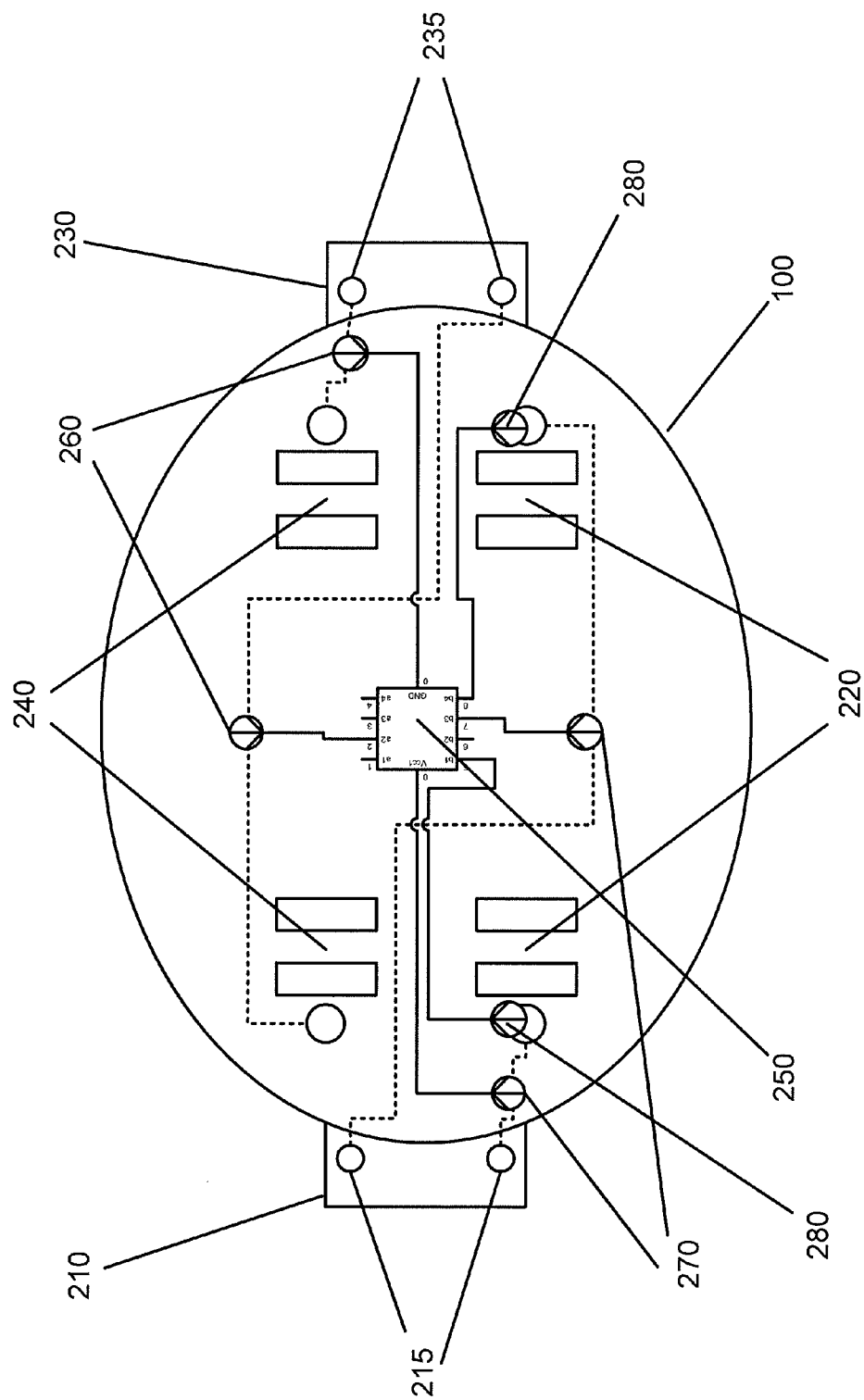
FIGS. 2a, 2b, 2c, and 2d show a meter collar socket interface point and interior circuit, in accordance with at least some of the embodiments described herein.

FIG. 2a shows a front-view of the interior of the meter collar 100, including socket and connection points 220, 240.

Utility-side DPGS connector port 210 may protrude from a side of meter collar 100, which may be cylindrical, and may include at least two contacts 215 corresponding to each phase of standard split or multiple phase electrical service. From contacts 215, wiring may connect with circuits that may terminate at utility-side meter interface contacts 220, which are the lower two of the four total meter interface contacts 220, 240. Meter collar 100 may be inserted between electric power meter 110 and meter socket box 120 and create a bridge between the utility-side connection points of meter socket box 120 and the utility-side connection points of the electric power meter 110. Electric energy produced by DPGS 135 connected to the utility-side DGPS connector port 210 may flow into the electric distribution grid 150.

Site-side DPGS connector port 230 may protrude from a side of meter collar 100, which may be cylindrical, and may include at least two contacts 235 corresponding to each phase of at least two phase electrical service From contacts 235, wiring may extend to connect with circuits that may terminate in site-side meter interface contacts 240, which are the upper two of the four total meter interface contacts 220, 240. Meter collar 100 may be inserted between electric power meter 110 and meter socket box 120, and therefore create a bridge between the site-side connection points of meter socket box 120 and site-side connection points of electric power meter 110. Electric energy produced by DPGS 135 connected to the site-side DGPS connector port 230 may flow into the on-site electric network 140.

Meter interface contacts 220, 240, housed within a socket on meter collar 100 may provide an interconnection point for electric power meter 110. Electric power meter 110 may either be plugged into a socket of meter collar 100 or otherwise incorporated into meter collar 100 as a single unified device.

A measurement and communications module 250 may optionally be housed within meter collar 100. Measurement and communications module 250 uses sensors 260, 270, 280 and may be disposed in meter collar 100 to measure voltages, currents, and other characteristics of energy flowing through the both phases of both/either the grid-side and/or the site-side DGPS connector ports 210, 230 as well as voltages, currents, and other characteristics of energy flowing through the both phases of utility side meter connection points 220 both from the grid to the site as well as from the DGPS at the site to the grid. Such sensors and measurement and communications module may store and transmit data to the utility, the homeowner, or a third party data on the generation of the DGPS as well as the net flow of energy from the grid to the site and from the DGPS at the site to the grid via a variety of available configurable digital communications protocols including but not limited to Internet Protocol, WiFi, Zigbee, Cellular, WiMax, HomePlug, and IPV6, among others. Additional data points may also be captured by the measurement and communication module.

Figure 2B:
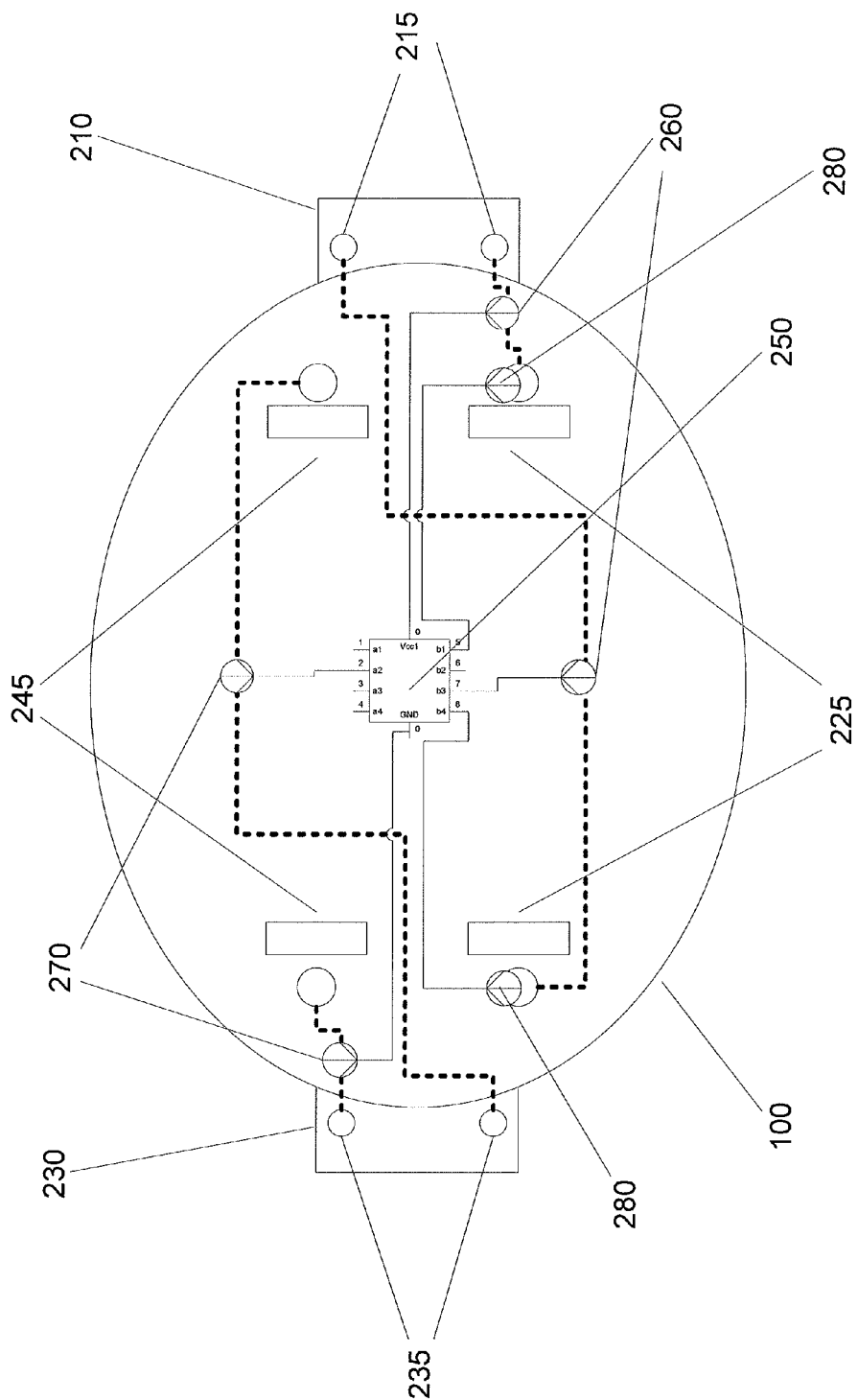

FIG. 2b shows a rear-view interior of the meter collar 100, displaying embedded connection points 225, 245 and internal circuits to meter socket box 120. Utility-side DPGS connector port 210 may protrude from a side of meter collar 100, which may be cylindrical, and may include at least contacts 215 corresponding to each sub-phase of standard service. From contacts 215, wiring may runs downward to connect with circuits that may terminate in utility-side meter socket box interface contacts 225, which are the lower two of the four total meter socket box interface contacts 225, 245. Meter collar 100 may be coupled to electric power meter 110 and to meter socket box 120 (the intended configuration), and therefore create a bridge between the utility-side connection points of the meter socket box 120 and the utility-side connection points of the electric power meter 110. Electric energy produced by a DPGS connected to the utility-side DGPS connector port 210 may flow into the electric distribution grid.

Site-side DPGS connector port 230 may protrude from a side of the meter collar 100, which may be cylindrical, and may include at least two contacts 235 corresponding to each 110 volt phase of standard 220 volt service. From contacts 235, wiring may run upward to connect with circuits that terminate at site-side meter socket box 120 interface contacts 245, which are the upper two of the four total meter interface contacts 225, 245. When meter collar 100 is inserted between electric power meter 110 and meter socket box 120 (the intended configuration), the meter collar 100 creates a bridge between site-side connection points of the meter socket box 120 and site-side connection points of the electric power meter 110. Electric energy produced by a DPGS connected to the site-side DGPS connector port 230 may flow into the on-site electric network 140.

Meter socket box interface contacts 225, 245 housed within an interface on the meter collar identical to an interface on a standard electric power meter 110, provide an interconnection point to a standard meter socket box 120. In all usages envisioned for the meter collar, it is plugged into the socket of the meter socket box 120.

An optional measurement and communications module 250 with sensors 260, 270, 280 may be housed within the meter collar 100. The function of the measurement and communications model is the same as detailed in FIG. 2a.

Figure 2C:
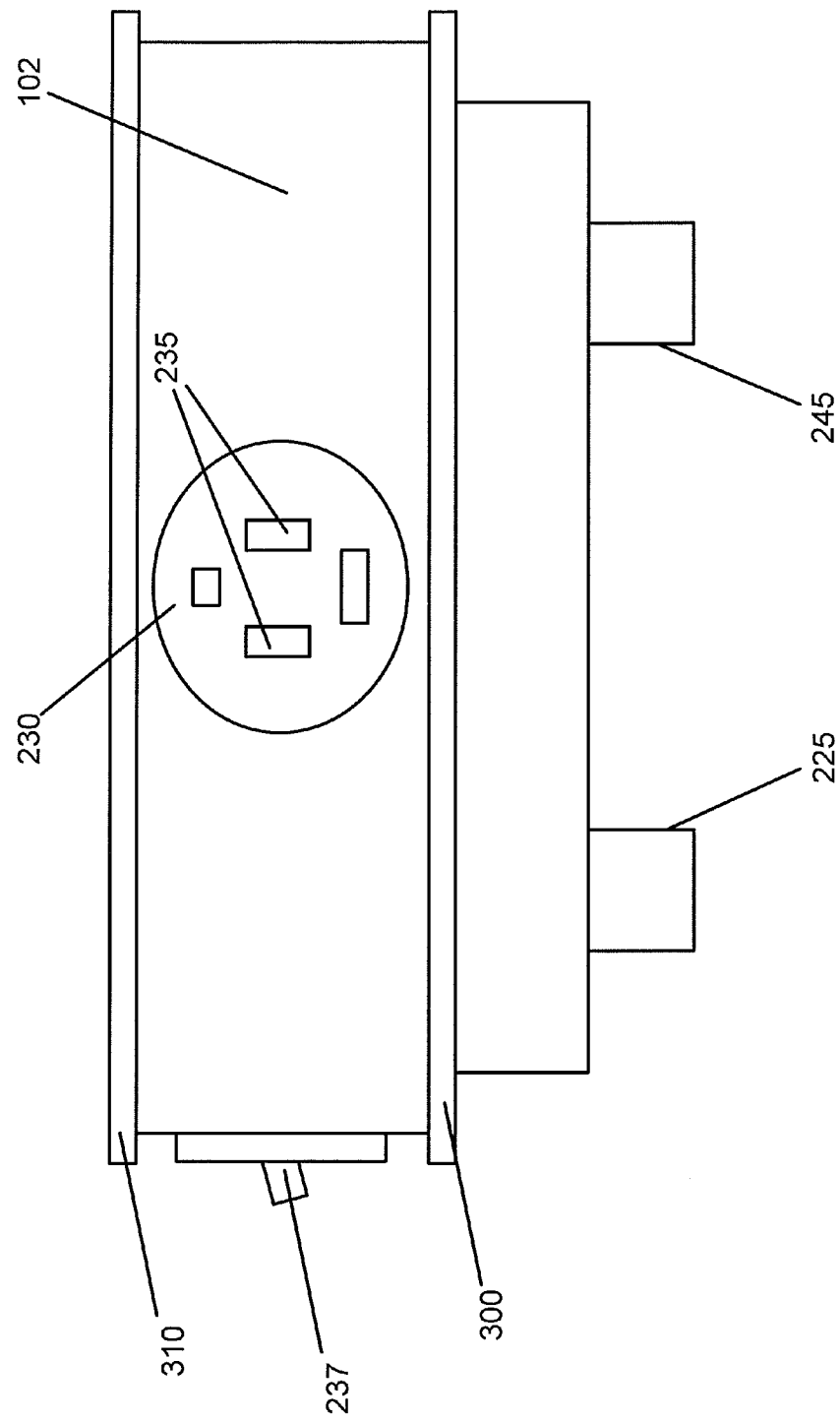

FIG. 2c shows an external side view of the meter collar 100. Electric power meter 110 may plug into a socket encompassing the majority of the top of the figure. Meter collar 100 may plug into meter socket box 140 by means of meter socket box connection points 225, 245.

Electric power meter 110 may be coupled to meter collar 100 by means of, e.g., a locking ring engaging with a locking lip 300. Meter collar 100 may be coupled to the meter box by means of an additional industry standard meter locking ring engaging with locking lip 310.

Meter collar 100 may include site-side DPGS connector port 230, which may include a Listed weatherized electric socket or other Listed connection means. The connector port may include contacts 235 also identified in FIGS. 2a and 2b. Site-side DPGS connector port 230 may be electrically downstream of meter 110. Utility-side DPGS connector port may be disposed opposite the site-side DPGS connector port 230, and may be electrically upstream of the meter. Site-side DPGS connector port 230 may be color-coded to help identify whether it is the upstream or downstream port.

Meter collar 100 may include an externally resettable overcurrent protection device 237.

Figure 2D:
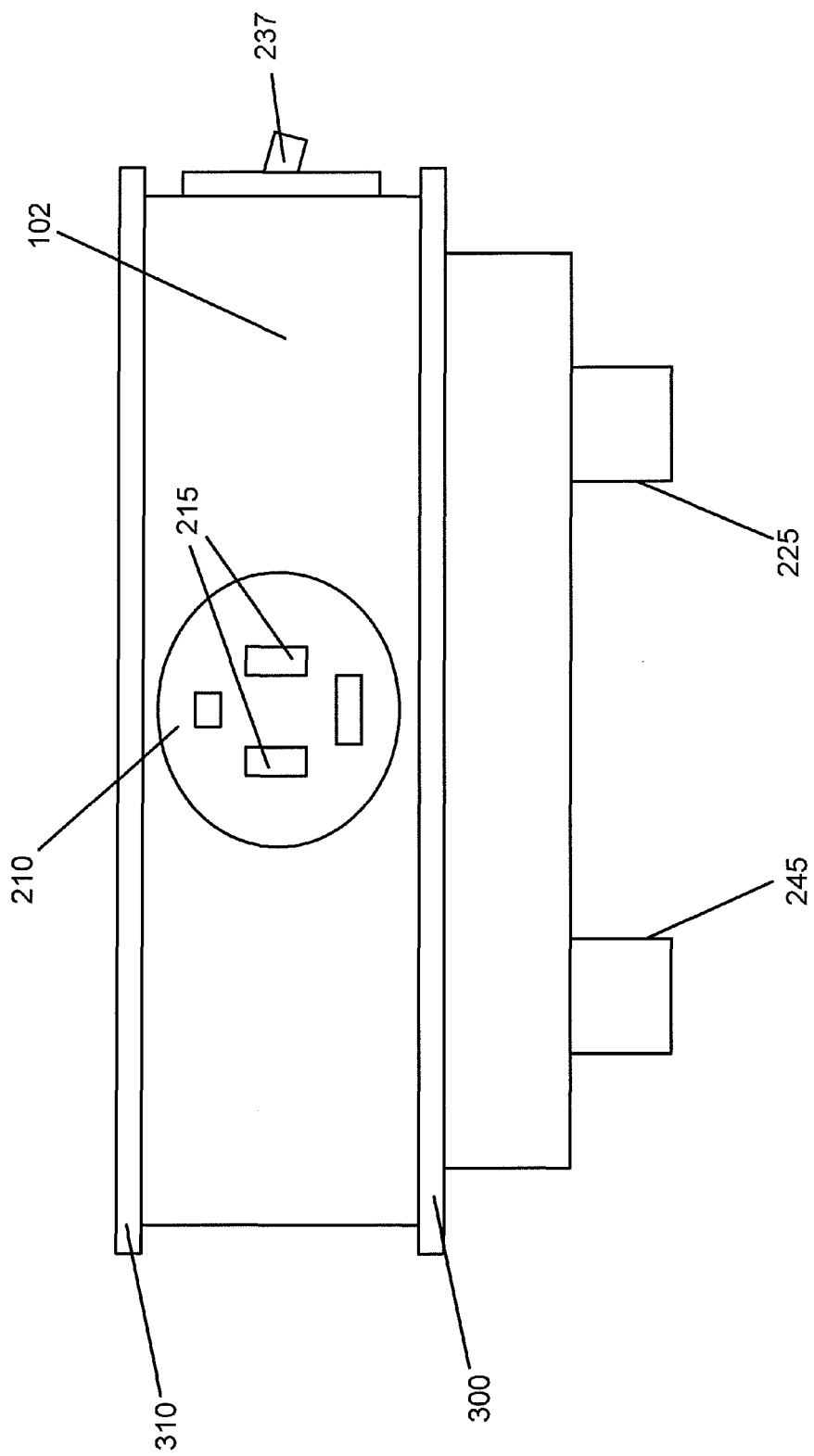

FIG. 2d shows an external view of meter collar 100 from the opposite side as FIG. 2c. All descriptions are similar to those described in FIG. 2c, except that the utility-side DPGS connector port 210 and its associated electrical contacts 215 are electrically downstream of the meter.

Figure 3A:
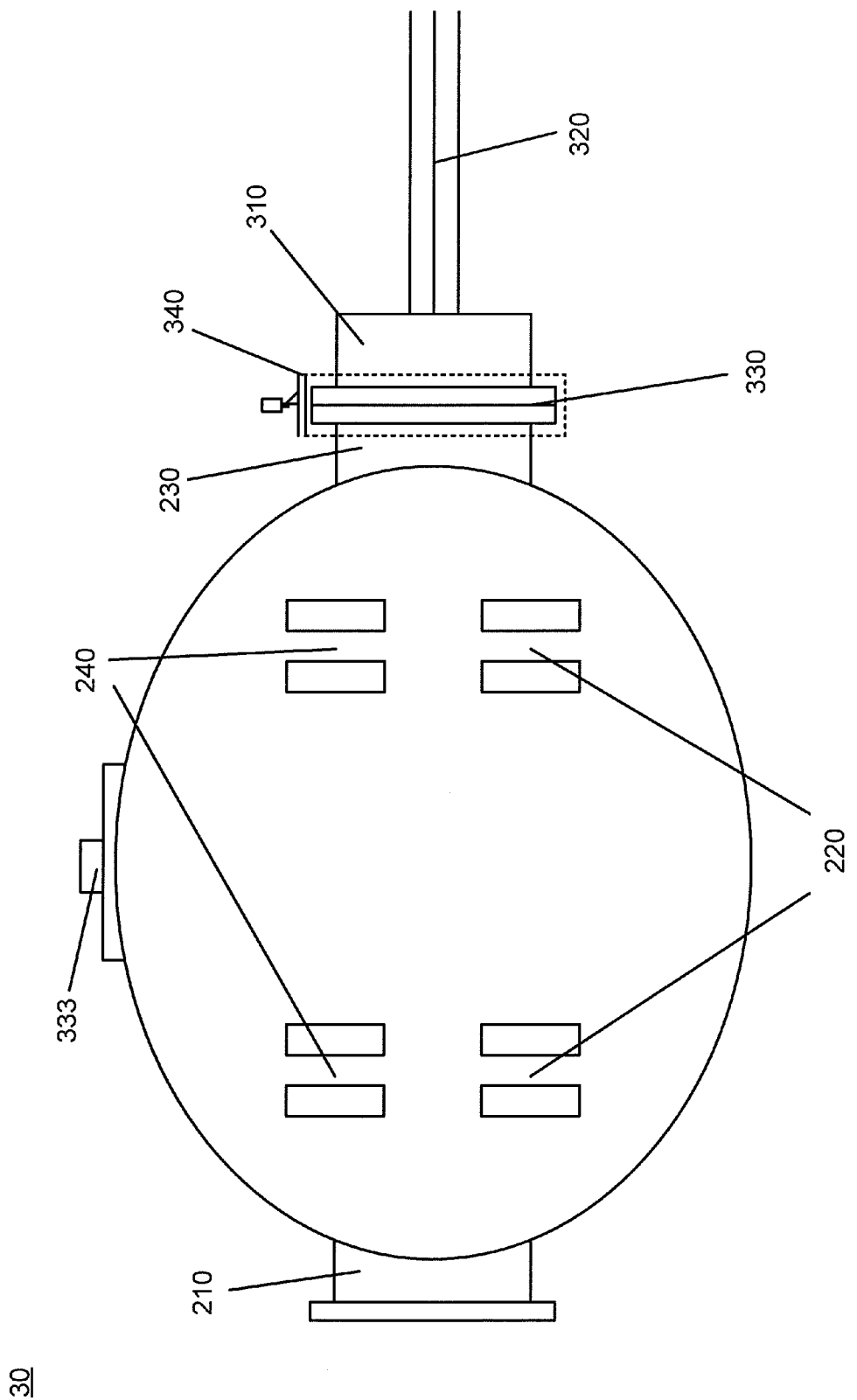
FIGS. 3a and 3b show a plug-socket interface, in accordance with at least some of the embodiments described herein.

FIG. 3a shows a front-view exterior of meter collar 100, for an example embodiment in which DPGS 130 is plugged-in to site-side DPGS connector port 230. Also shown are the DPGS interconnection point 310 and locking mechanism 340 as well as the socket and connection points 220, 240 for the electric power meter (not pictured).

Site-side DPGS connector port 230 may protrude from meter collar 100, which may be cylindrical. Plugged-in to the port is a DPGS plug 310 to which may be attached to DPGS power wires 320. The DPGS power wires 320 carry electricity from the DPGS.

DPGS plug 310 may be coupled to site-side DPGS connector port 230 by means of DPGS port locking ring 340 wrapped around locking lips 330 of the port and the plug. The locking ring may lock the plug in place to guard against tampering or theft.

Meter collar 100 may include an externally resettable overcurrent protection device 333.

Figure 3B:
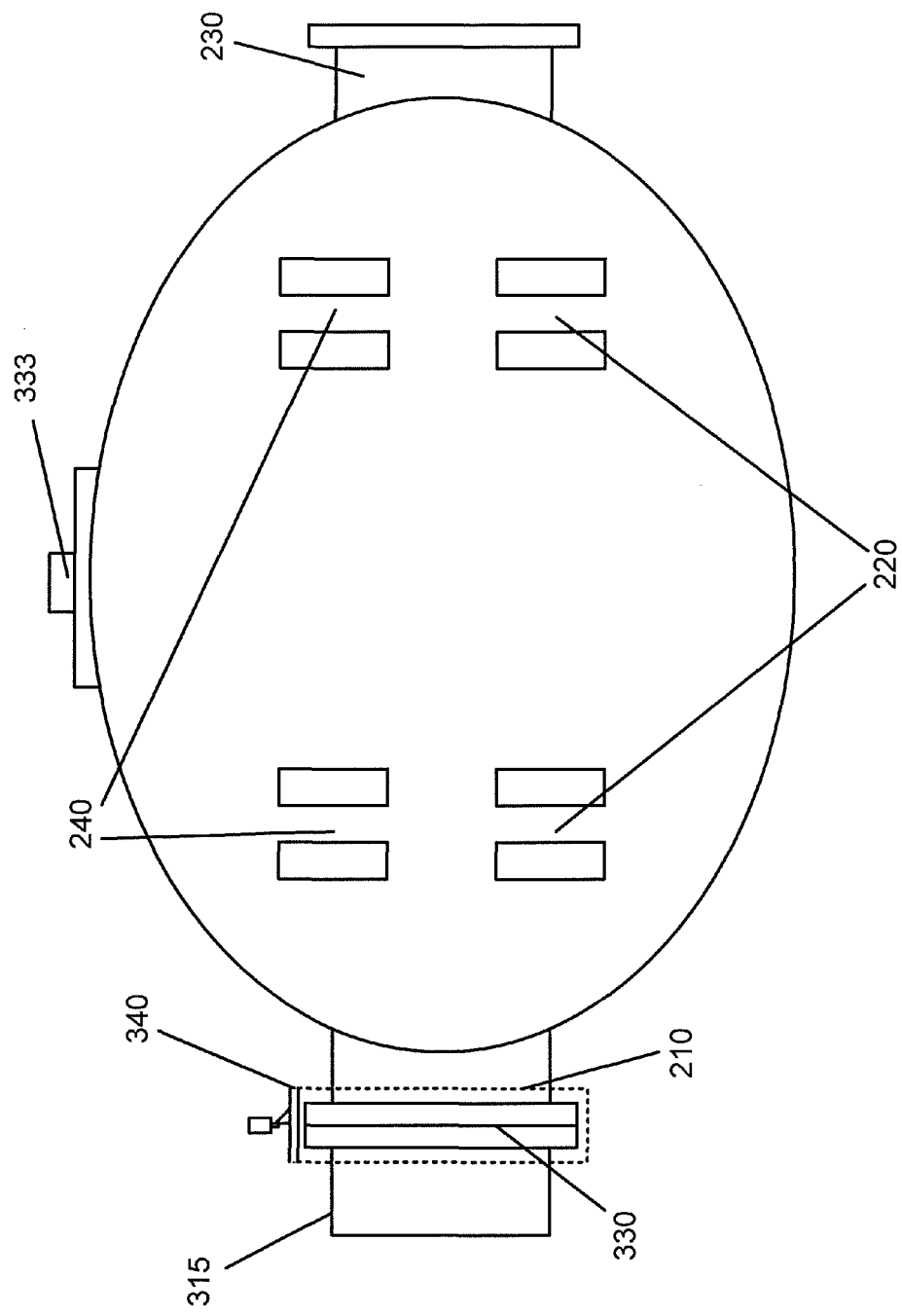

FIG. 3b shows a counterpart to FIG. 3a, wherein dummy plug 315 may be plugged into utility-side DPGS connector port 210. Dummy plug 315 may be used in the place of a DPGS plug, and may be secured to the port using the same locking ring and locking lips combination described in FIG. 4a.

For reference in FIGS. 3a and 3b, meter connection points 220, 240 are shown in the center of the figure and the utility-side DPGS connector port 210 protrudes from the left side of the cylindrical body of the meter collar 100. Alternatively, the DPGS may be connected to the utility-side DPGS connector, with the positions of DPGS plug and the dummy plug exchanged.

We claim:

1. A meter collar that connects a power meter socket to an electrical generation source, comprising:
    a housing that includes therein:
        first contacts to connect to utility-side contacts of a meter socket box;
        second contacts to connect to customer-side contacts of a meter socket box;
        connection points to engage with the connection points of the meter;
        an interface circuit, disposed electrically upstream of the meter, to enable an electric connection to an on-site power generation system;
        another interface circuit, disposed electrically downstream of the meter, to enable another electric connection to the on-site power generation system;
        a measurement and communications module to measure characteristics of energy that flows through at least one of the interface circuits and to communicate the characteristics of this energy flow to an electrical distribution grid operator; and
        an integrated resettable overcurrent protection device to control the energy that flows through at least one of the interface circuits.

2. The meter collar of claim 1, further comprising:
    a non-conductive plug;
    a locking mechanism,
        wherein the non-conductive plug and locking mechanism, in tandem, are to secure whichever of the first electrical connection point and the second electrical connection point is not in use.

3. A metering system, comprising:
    a meter socket box, including:
        a receiving electrical connection point;
    an adapter that plugs into the receiving electrical connection point of the meter socket box, the adapter including:
        contacts to respectively connect with private structure-side contacts of the meter socket box, and
        meter contacts to respectively connect with the electrical distribution grid-side contacts of the meter socket box;
    a self-contained meter collar that plugs into the adapter, the meter including:
        first contacts to connect to utility-side contacts of a meter socket box;
        second contacts to connect to customer-side contacts of a meter socket box;
        one or more electrical connection points to respectively connect with the meter contacts of the adapter,
            wherein the first contacts connect to the utility side contacts of the meter socket box simultaneously as the second contacts connect to the customer-side contacts of the meter socket box and the connection points engage with the connection points of the meter
        an interface circuit, disposed electrically upstream of the meter, to enable an electrical connection to an on-site power generation system,
        another interface circuit, disposed electrically downstream of the meter, to enable electrical connection to the on-site power generation system, and an integrated externally resettable overcurrent protection device to control the energy that flows through at least one of the interface circuits.

4. The metering system of claim 3, wherein the adapter further includes:
   a measurement and communications module to measure characteristics of energy that flows through at least one of interface circuits.

5. The metering system of claim 4, wherein the measurement and communications module is configured to further transmit to an electrical distribution grid operator the measured characteristics of the energy that flows through at least one of the interface circuits.

6. The metering system of claim 4, wherein the measurement and communications module is to further transmit to a private entity the measured characteristics of the energy that flows through at least one of the interface circuits.

7. The metering system of claim 4, wherein the measurement and communications module is to further measure the characteristics of energy that flows to an electrical distribution grid.

8. The metering system of claim 4, wherein the measurement and communications module is to further measure the characteristics of energy that flows to and from an electrical distribution grid.

9. The metering system of claim 4, wherein the measurement and communications module is to further measure the characteristics of energy that flows to an electric power grid.

10. The metering system of claim 4, wherein the measurement and communications module is to further measure the characteristics of energy that flows to and from an electric power grid.

* * * * *